(12) United States Patent
Ohmi et al.

(10) Patent No.: US 8,465,719 B2
(45) Date of Patent: Jun. 18, 2013

(54) SILICON CARBIDE SUBSTRATE, SEMICONDUCTOR DEVICE, WIRING SUBSTRATE, AND SILICON CARBIDE MANUFACTURING METHOD

(75) Inventors: Tadahiro Ohmi, Miyagi (JP); Akinobu Teramoto, Miyagi (JP); Sumio Sano, Tokyo (JP); Fusao Fujita, Okayama (JP)

(73) Assignees: National University Corporation Tohoku University, Miyagi (JP); Mitsui Engineering & Shipbuilding Co., Ltd., Tokyo (JP)

( * ) Notice: Subject to any disclaimer, the term of this patent is extended or adjusted under 35 U.S.C. 154(b) by 367 days.

(21) Appl. No.: 12/425,247

(22) Filed: Apr. 16, 2009

(65) Prior Publication Data

US 2009/0263306 A1    Oct. 22, 2009

(30) Foreign Application Priority Data

Apr. 18, 2008   (JP) .................. 2008-108815

(51) Int. Cl.
  *C01B 31/36*   (2006.01)
(52) U.S. Cl.
  USPC .......................................................... 423/345
(58) Field of Classification Search
  USPC .......................................................... 423/345
  See application file for complete search history.

(56) References Cited

U.S. PATENT DOCUMENTS

| | | | | |
|---|---|---|---|---|
| 3,966,855 A * | 6/1976 | Hollenberg et al. | .......... | 264/120 |
| 6,111,452 A * | 8/2000 | Fazi et al. | .................... | 327/355 |
| 6,356,173 B1 | 3/2002 | Nagata et al. | | |
| 6,964,917 B2 * | 11/2005 | Tsvetkov et al. | ............ | 438/512 |
| 2006/0234058 A1 | 10/2006 | Ohmi et al. | | |

FOREIGN PATENT DOCUMENTS

| JP | 2000-228461 | 8/2000 |
|---|---|---|
| JP | 2001-135748 | 5/2001 |
| JP | 2003-68928 | 3/2003 |
| JP | 2005-047753 A | 2/2005 |
| JP | 2006-095637 | 4/2006 |
| JP | 2007-165459 A | 6/2007 |
| JP | 2007-180119 | 7/2007 |

OTHER PUBLICATIONS

Office Action mailed Nov. 16, 2011 in Japan Application No. 2008-108815, with English translation of the relevant part.
Japanese Office Action for JP application No. 2008-108815 and partial English translation; issued May 23, 2012; 3 pages.

* cited by examiner

*Primary Examiner* — Stuart Hendrickson
(74) *Attorney, Agent, or Firm* — Foley & Lardner LLP

(57) ABSTRACT

A silicon carbide substrate has a high-frequency loss equal to or less than 2.0 dB/mm at 20 GHz is effective to mount and operate electronic components. The silicon carbide substrate is heated at 2000° C. or more to be reduced to the high-frequency loss equal to 2.0 dB/mm or less at 20 GHz. Moreover, manufacturing the silicon carbide substrate by CVD without flowing nitrogen into a heater enables the high-frequency loss to be reduced to 2.0 dB/mm or less.

3 Claims, 6 Drawing Sheets

SILICON CARBIDE SUBSTRATE, SEMICONDUCTOR DEVICE, WIRING SUBSTRATE, AND SILICON CARBIDE MANUFACTURING METHOD

This application is based upon and claims the benefit of priority from Japanese Patent Application No. 2008-108815, filed on Apr. 18, 2008, the disclosure of which is incorporated herein in its entirety by reference.

TECHNICAL FIELD

The present invention relates to a silicon carbide (SiC) substrate, and to a semiconductor device including the silicon carbide substrate, a wiring substrate including the silicon carbide substrate, and a manufacturing method of the silicon carbide substrate.

BACKGROUND ART

A silicon carbide substrate typically has an excellent resistance to corrosion by chemicals such as acids and alkalis, and therefore is used for processing/adjustment of a polishing pad used in CMP (chemical mechanical polishing), for example, as described in JP-A-2006-95637 (Patent Document 1).

On the other hand, as described in Japanese Patent Application No. 2007-184896 (Patent Document 2), a silicon carbide substrate is splinterless in comparison with a silicon substrate and the like and also has high thermal conductivity, and accordingly is contemplated for use as an SOI (Semiconductor On Insulator) substrate. On using the silicon carbide substrate as the SOI substrate, silicon carbide is often used as a base material of the SOI substrate and a silicon substrate is formed on the silicon carbide base via an insulating film. That is, it often happens in such an SOI substrate that silicon carbide is used as a support member while silicon is used as an element forming region for forming a semiconductor element.

Moreover, proposal has been also offered like in JP-A-2000-228461 (Patent Document 3) about forming a low-loss wiring substrate for high-frequency applications by using ceramic containing silicon carbide.

SUMMARY OF THE INVENTION

Recent considerations have been made not only about using a silicon carbide substrate as a support substrate or a wiring substrate as described in Patent Documents 2 and 3, but also about mounting various electronic components, such as a semiconductor device, on a silicon carbide substrate or about forming electronic components in a silicon carbide substrate. In such cases where electronic components are directly mounted on a silicon carbide substrate, a conventional silicon carbide substrate can no longer be used without any improvement.

For example, a silicon carbide substrate for electronic components intended for use in a high-frequency band, such as a GHz band, should exhibit a low loss property at high frequencies. However, a conventional silicon carbide substrate has a large high-frequency loss characteristic and is therefore insufficient in electrical characteristics. Accordingly, no proposal has presently been made regarding an example of a silicon carbide substrate where electronic components are actually mounted.

The present invention seeks to provide a silicon carbide substrate having a low high-frequency loss.

In addition, the present invention seeks to provide a semiconductor device, a wiring substrate, and the like including a silicon carbide substrate having a low high-frequency loss.

Furthermore, the present invention seeks to provide a manufacturing method of silicon carbide having a low high-frequency loss.

According to a first aspect of the present invention, there is provided a silicon carbide substrate which has a loss equal to or less than 2 dB/mm at a frequency of 20 GHz.

According to a second aspect of the present invention, there is provided the silicon carbide substrate which is formed by polycrystalline silicon carbide.

According to a third aspect of the present invention, there is provided a semiconductor device comprising a substrate that is formed by polycrystalline silicon carbide and that has a loss equal to or less than 2 dB/mm at a frequency of 20 GHz.

According to a fourth aspect of the present invention, there is provided a wiring substrate comprising the silicon carbide substrate according to the first aspect. Namely, the wiring substrate comprises the silicon carbide substrate which has a loss equal to or less than 2 dB/mm at a frequency of 20 GHz.

According to a fifth aspect of the present invention, there is provided a silicon carbide manufacturing method comprising preparing preliminary silicon carbide substrate that has a loss higher than 2 dB/mm at a frequency of 20 GHz and subjecting the preliminary silicon carbide substrate to heat treatment to reduce the loss equal to or less than 2 dB/mm.

According to a sixth aspect of the present invention, there is provided the silicon carbide manufacturing method, wherein the heat treatment is performed at 2000° C. or more.

According to a seventh aspect of the present invention, there is provided the silicon carbide manufacturing method, wherein the heat treatment is performed under an atmosphere including a noble gas.

According to an eighth aspect of the present invention, there is provided the silicon carbide manufacturing method, wherein a pressure of the heat treatment is an atmospheric pressure.

According to a ninth aspect of the present invention, the silicon carbide manufacturing method, wherein the heat treatment is performed by increasing a temperature to 800° C. under a nitrogen atmosphere and by further increasing to 2000° C. or more under a noble gas atmosphere.

According to a tenth aspect of the present invention, there is provided the silicon carbide manufacturing method, wherein the heat treatment is performed in a heat treatment furnace that includes a member formed by any of graphite, silicon carbide, and a material containing graphite and silicon carbide.

According to an eleventh aspect of the present invention, there is provided the silicon carbide manufacturing method, wherein the preliminary silicon carbide is manufactured by CVD.

According to a twelfth aspect of the present invention, there is provided the silicon carbide manufacturing method, wherein the CVD is performed using a CVD furnace having a structure for preventing entry of nitrogen.

According to a thirteenth aspect of the present invention, there is provided the silicon carbide manufacturing method, wherein the CVD is performed using a furnace that includes a reaction unit and a heater unit surrounding the reaction unit, in a state of not flowing nitrogen into the heater unit.

DESCRIPTION OF THE EXEMPLARY EMBODIMENT

A preferred embodiment to which the present invention is applied is described in detail below, with reference to drawings.

Referring to FIGS. 1A to 1D, description will be made at first about a method of manufacturing a silicon carbide substrate which is obtained by a preprocessing step and which is referred to as a preliminary silicon carbide substrate. The preliminary silicon carbide substrate serves to manufacture a silicon carbide (SiC) substrate according to the present invention.

Figure 1A:
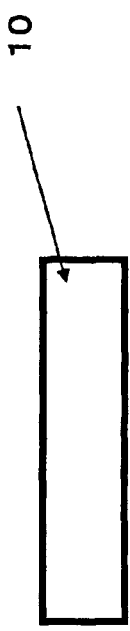
FIGS. 1A to 1D are a process chart showing a method of previously manufacturing a preliminary SiC substrate which is used for manufacturing a SiC substrate according to the present invention.
Figure 1B:
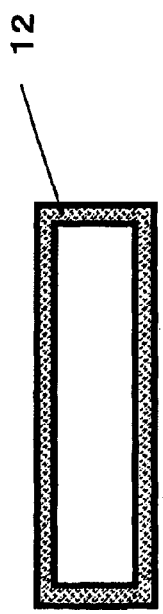

First, a graphite base 10 is prepared as shown in FIG. 1A. In this example, provision is made about a disc-shaped graphite base which is made of high purity graphite and which has a predetermined size in accordance with a size of the SiC substrate. Thereafter, the disc-shaped graphite base 10 is introduced into a CVD apparatus. Within the CVD apparatus, silicon carbide 12 is grown to a predetermined thickness on a top surface, a bottom surface, and a peripheral surface of the graphite base 10 by CVD, as shown in FIG. 1B. The grown silicon carbide 12 has a 3C—SiC crystal structure. In more detail, the CVD apparatus has a CVD furnace including a reaction unit and a heater unit into which gas (e.g. nitrogen gas) can be introduced. The disc-shaped graphite base 10 is heated and kept at a predetermined temperature (e.g. 1000 to 1600° C.) within a hydrogen atmosphere within the above-mentioned CVD apparatus and, as a result, the silicon carbide 12 is grown up on the disc-shaped graphite base 10, as illustrated in FIG. 1B.

Specifically, a pressure in the CVD apparatus is kept at 1.3 kPa. In this state, 5 to 20% by volume of $SiCl_4$, $C_3H_8$, and the like are fed as raw materials of SiC, together with hydrogen gas ($H_2$) as carrier gas. Alternatively, a combination of raw materials of SiC may also be $SiH_4/CH_4$, $SiH_4/C_2H_4$, $SiH_4/C_3H_8$, $SiCl_4/CCl_4$, $SiCl_4/CH_4$, $CH_3SiCl_3$, $(CH_3)_2SiCl_2$, or the like. Feeding these gases brings about growth of the 3C—SiC crystal 12 (which is an SiC layer) to a desired thickness (e.g. 0.5 to 1 mm) on the surfaces of the graphite base 10.

In this example, two types of SiC substrates have been prepared by manufacturing an SiC substrate obtained without flowing nitrogen for preventing wear of the heater, and by manufacturing another SiC substrate obtained by flowing nitrogen.

Figure 1C:
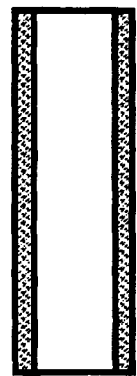

Next, the graphite base 10 covered with the 3C—SiC crystal is mechanically polished to grind and remove SiC on the peripheral surface as shown in FIG. 1C. For instance, the mechanical polishing is conducted using diamond abrasive grain.

Figure 1D:
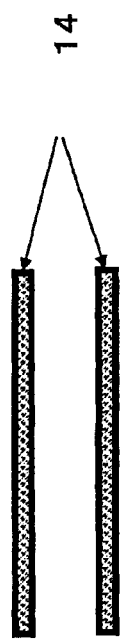

Subsequently, the graphite base 10 which has upper and bottom surfaces covered with 3C—SiC is heated under an oxygen atmosphere at 900 to 1400° C. As a result, the graphite base 10 is burnt out and is removed as shown in FIG. 1D. Thus, two sheets of 3C—SiC substrate 14 are obtained (FIG. 1D).

Each 3C—SiC substrate 14 is then mechanically polished. Lastly, after chamfering wafer edge portions and cleaning, a predetermined check is performed. Thus, a high purity SiC substrate is manufactured. The 3C—SiC substrate obtained in this way is formed by 3C—SiC crystal (polycrystalline SiC) which is one of the polytypes of SiC crystal. Though the SiC substrate of 3C—SiC is described in this example, the polytype of the high-frequency-application SiC substrate of the present invention may be, for example, 4H—SiC, and is not limited to a particular polycrystalline structure of silicon carbide (SiC). The SiC substrate manufactured by CVD or the like is hereafter referred to as a preliminary silicon carbide (SiC) substrate.

Figure 2:
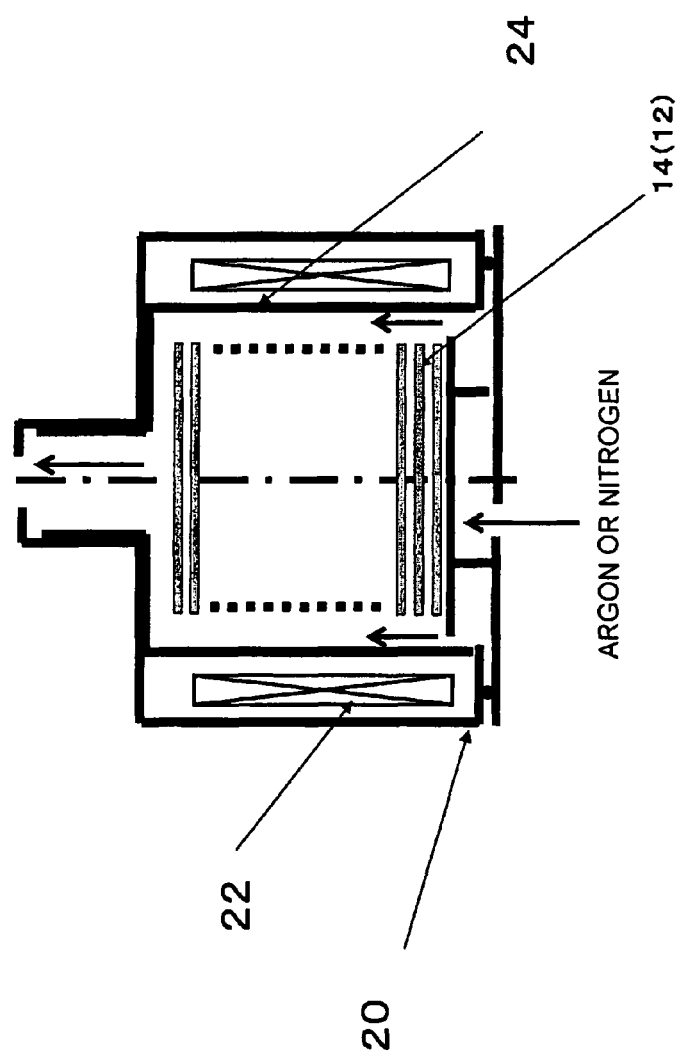
FIG. 2 shows a heat treatment furnace used when the SiC substrate according to the present invention is manufactured.

Referring to FIG. 2, description will be made about a method of improving the high-frequency loss of the silicon carbide substrate (preliminary silicon carbide (SiC) substrate) 14 obtained as shown in FIG. 1D. Practically, it has been found out that the high-frequency loss of the preliminary silicon carbide substrate 14 can be improved by heat treatment in a heat treatment furnace shown in FIG. 2.

The heat treatment furnace shown in FIG. 2 has a furnace body 20 made of stainless steel, and includes a heat treatment unit (reaction unit) 21 and a heater unit 22 within the furnace body 20. The heat treatment unit 21 and the heater unit 22 are partitioned by partition walls 24 covered with graphite, silicon carbide, or a material containing both of them. Moreover, a noble gas, such as argon, helium, or the like and nitrogen can be selectively flowed into the heat treatment unit 21 in the furnace, and the furnace can be evacuated into a vacuum by a vacuum pump.

In a heat treatment method, provision is at first made about the preliminary SiC substrates 14. In this case, the graphite base 12 covered with SiC substrates may be prepared without removing the graphite base 12. Such preliminary SiC substrates 14 are set in the reaction unit 21 in the furnace 20. On setting the preliminary SiC substrates 14 (12) in the furnace 20, it is desirable to set the preliminary SiC substrates 14 (12) by the use of jigs made of graphite. However, the preliminary SiC substrate 14 may be stacked by directly placing one substrate on top of another. After setting the SiC substrates 14, heat treatment shown in FIG. 3 is performed.

Herein, provision has been made about two types of the preliminary SiC substrates, namely, the preliminary SiC substrates (referred to as A substrates) manufactured without flowing nitrogen into the heater unit and the preliminary SiC substrates (referred to as B substrates) manufactured in a state of flowing nitrogen into the heater unit when growing SiC in the CVD apparatus. The above-mentioned A and B substrates are subjected to the heat treatment by using the heat treatment furnace shown in FIG. 2.

Figure 3:
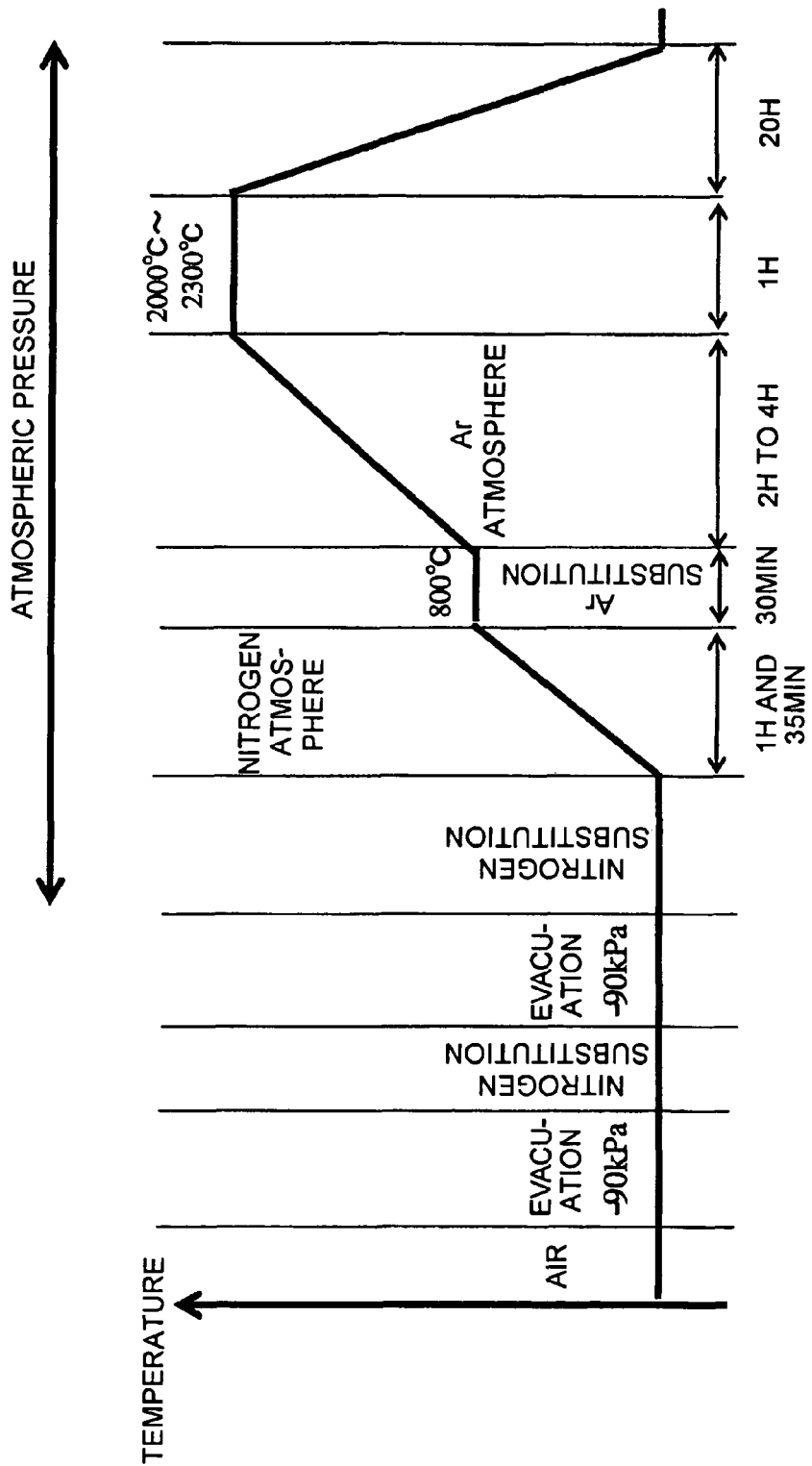
FIG. 3 shows a heat treatment process in the heat treatment furnace shown in FIG. 2.

As shown in FIG. 3, the preliminary SiC substrates 14 are set in the furnace and, thereafter, an inner space of the furnace is reduced to a pressure of −90 kPa, and then an atmosphere in the furnace is substituted with nitrogen. This process is repeated twice as illustrated in FIG. 3. This process serves to substitute the air in the furnace with nitrogen. This substitution process may be performed twice or more. Moreover, a noble gas such as argon, helium, or the like may be used other than nitrogen. After substituting the air in the furnace with nitrogen, a temperature in the furnace is increased to 800° C. under a nitrogen atmosphere. Once 800° C. has been reached, the nitrogen atmosphere in the furnace is substituted with an argon atmosphere. This substitution requires about 30 minutes. The temperature up to 800° C. is measured using a thermocouple.

Subsequently, the temperature is increased from 800° C. to a treatment temperature (2000° C. to 2300° C.) under the argon atmosphere, and this heat treatment temperature is maintained for about 1 hour. The temperature from 800° C. to the treatment temperature (2000° C. to 2300° C.) is measured using a radiation thermometer, since the temperature of 1700° C. or more cannot be measured with a thermocouple. Though the thermocouple and the radiation thermometer are used in this heat treatment furnace, other measurement devices capable of such measurements may be used instead. According to an experiment, a high heat treatment temperature such as 2300° C. is found to be preferable. Though the treatment time period is 1 hour in the experiment, the treatment time period may be adjusted so as to reduce the high-frequency loss.

After the heat treatment, the treatment temperature is decreased to a room temperature for about 20 hours. The surface of the SiC substrate after the heat treatment is polished and cleaned. Thus, a silicon carbide (SiC) substrate according to the present invention is obtained.

Figure 4:
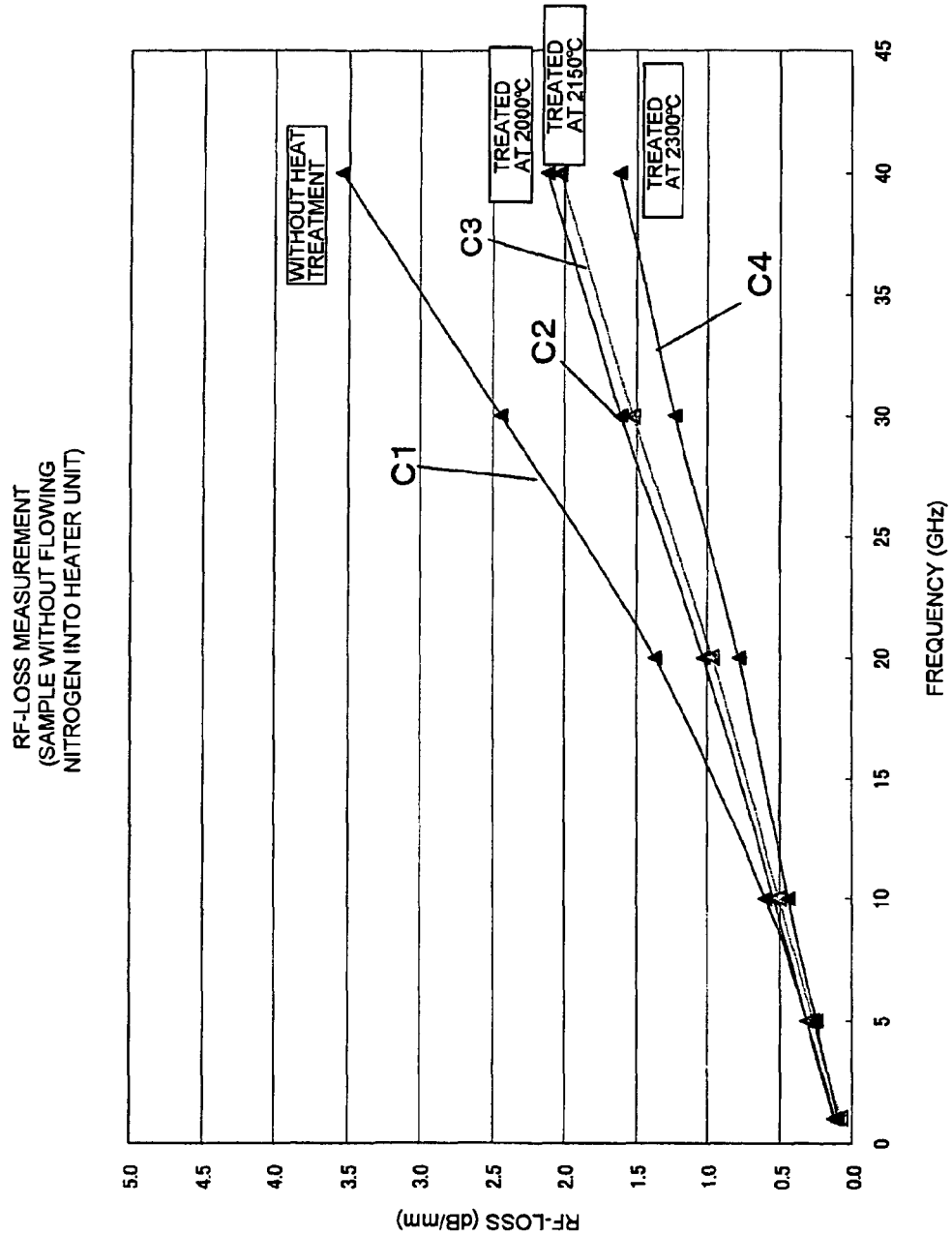
FIG. 4 is a graph showing high-frequency loss characteristics of a SiC substrate obtained by carrying out the heat treatment process shown in FIGS. 2 and 3.

FIG. 4 shows high-frequency loss characteristics of a SiC substrate obtained by subjecting the A substrates to the heat treatment. In FIG. 4, a horizontal axis represents a frequency in a GHz band, and a vertical axis represents a high-frequency loss (RF-loss (dB/mm)). A curve C1 in FIG. 4 shows a characteristic of the A substrates subjected to no heat treatment mentioned above. As is clear from the curve C1 in FIG. 4, the SiC substrates (i.e. the A substrates) manufactured without flowing nitrogen gas into the CVD apparatus have an extremely low high-frequency loss of 1.4 dB/mm at 20 GHz even when the heat treatment is not performed.

According to the findings of the inventors of the present invention, it has been found out that a SiC substrate exhibiting a high-frequency loss of 2.0 dB/mm or less at 20 GHz has practically no problem of mounting electronic components. Therefore, the SiC substrates manufactured without flowing nitrogen gas have adequate high-frequency loss characteristics.

Furthermore, curves C2, C3, and C4 respectively indicate high-frequency loss characteristics of SiC substrates obtained by subjecting the A substrates to the heat treatment of FIG. 3 at 2000° C., 2150° C., and 2300° C. As are clear from the comparison of the curves C2 to C4, the high-frequency loss can be reduced or improved by performing the heat treatment in comparison with the A substrates without the heat treatment. Moreover, the high-frequency loss is lower when the heat treatment temperature becomes higher.

In fact, the high-frequency loss of the SiC substrates which is heat treated at 2300° C. is lower than 1 dB/mm at 20 GHz, whereas the high-frequency losses of the SiC substrates which are heat treated at 2000° C. and 2150° C. are about 1 dB/mm at 20 GHz. Moreover, the high-frequency losses of the SiC substrates which are heat treated at 2000° C. and 2150° C. are about 2 dB/mm at 40 GHz, while the high-frequency loss of the SiC substrate which is heat treated at 2300° C. is about 1.5 dB/mm at 40 GHz.

As described above, a SiC substrate which is heat treated at 2000° C. or more is sufficiently usable in terms of its high-frequency loss at 40 GHz.

Figure 5:
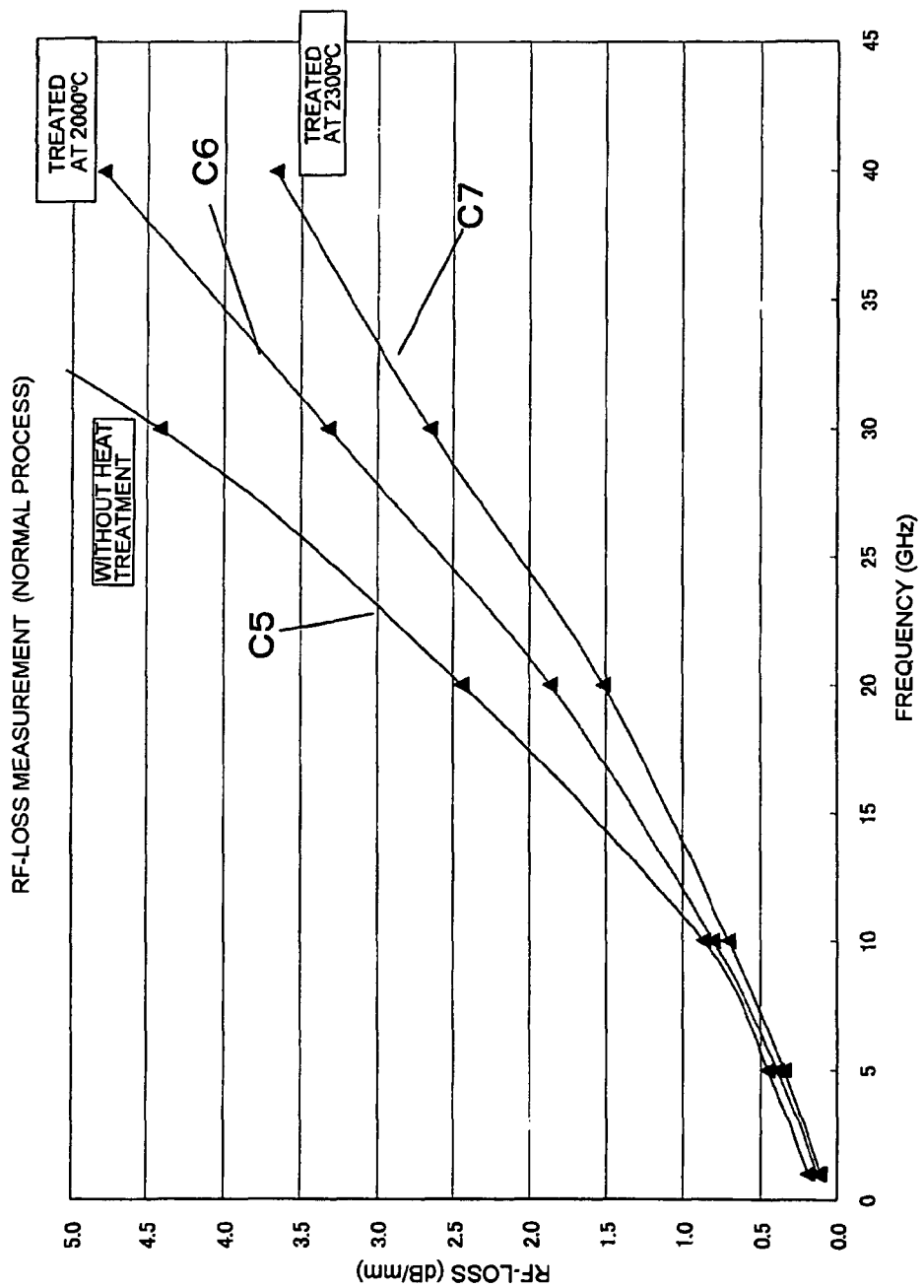
FIG. 5 is a graph showing high-frequency loss characteristics of another SiC substrate obtained by the heat treatment process shown in FIGS. 2 and 3.

FIG. 5 shows high-frequency loss characteristics in the case of subjecting the B substrates to the heat treatment. As shown in FIG. 5, a curve C5 indicates a high-frequency loss characteristic of the B substrates without the heat treatment. Curves C6 and C7 represent high-frequency loss characteristics of B substrates which are heat treated at 2000° C. and at 2300° C., respectively.

As is clear from the curve C5, the B substrate without the heat treatment exhibits a high-frequency loss of about 2.5 dB/mm at 20 GHz, and therefore might be inadequate for mounting of electronic components and the like. However, as shown by the curves C6 and C7, the B substrates subjected to the heat treatment at 2000° C. and 2300° C. exhibit a high-frequency loss of 2.0 dB/mm or less at 20 GHz and therefore can be used as substrates for electronic component mounting.

Next, description is made about a method of measuring the high-frequency losses (dB/mm) shown in FIGS. 4 and 5.

Figure 6:
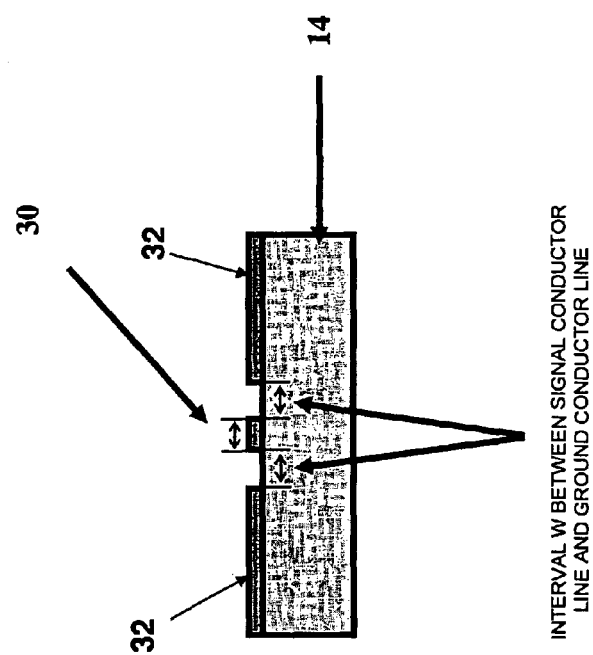
FIG. 6 is a diagram for describing a measurement method for measuring high-frequency loss characteristics of an SiC substrate.

FIG. 6 shows a wiring diagram for high-frequency loss measurement. As shown in the drawing, a signal conductor line 30 with a line width S is placed at a center part of a surface of the SiC substrate 14, and a ground conductor line 32 is placed on both sides of the signal conductor line 30 with an interval W. Here, the interval W between the signal conductor line 30 and the ground conductor line 32 and the signal conductor line width S are changed to adjust to characteristic impedance of 50Ω. In this case, the signal conductor line 30 is 1 mm in length.

The signal conductor line 30 and the ground conductor line 32 are formed by depositing about 1 μm of Al on the SiC substrate 14 by an evaporation method, and forming a coplanar line pattern made up of the signal conductor line 30 and the ground conductor line 32 by photoresist. Though both the signal conductor line 30 and the ground conductor line 32 are formed by the evaporation method in this example, the conductor lines 30 and 32 may be formed using a method other than the evaporation method, such as a sputtering method, a CVD method, a plating method, or the like. Furthermore, though Al is used as the conductor lines 30 and 32 in the illustrated example, a metal such as Cu, Au, or the like may be used instead.

A signal is fed from one terminal of the conductor lines 30 and 32, and a signal transmitted through another terminal is measured using a network analyzer. When doing so, transmission characteristics at signal frequencies from 10 MHz to 50 GHz are measured.

In the measurement results shown in FIGS. 4 and 5, values of operation transmission matrix ($S_{21}$) of signal passage characteristics of the signal at 1, 5, 10, 20, 30, and 40 GHz are shown in dB/mm.

The above embodiment describes the SiC substrate for mounting and implementing electronic components. However, the SiC substrate according to the present invention is not limited to this, and can also be used as a wiring substrate, a substrate for polishing pad adjustment, or a SOI support substrate. Examples of the SiC substrate for mounting and implementing electronic components include a SiC substrate on which a Si layer or another semiconductor layer is formed where the semiconductor layer serves as at least some of the electronic components, and a SiC substrate on which separately-produced electronic components are mounted. Examples of the SOI support substrate include a SOI structure in which an insulating layer is provided on a SiC substrate and a semiconductor layer such as Si is provided on the insulating layer. Examples of the wiring substrate include a structure in which a wiring layer of a predetermined pattern is provided on a surface of a SiC substrate directly or via another insulating layer.

What is claimed is:
1. A silicon carbide substrate manufacturing method comprising:

preparing a preliminary silicon carbide substrate that is formed by chemical vapor deposition (CVD) and that has an RF loss higher than 2 dB/mm at a frequency of 20 GHz, when the RF loss is represented by an operation transmission matrix (S21) of signal passage characteristics; and heating the preliminary CVDed silicon carbide substrate in a noble gas atmosphere at a temperature between 2000° C. and 2300° C. to reduce the RF loss equal to or less than 2 dB/mm; and wherein:

the preliminary CVDed silicon substrate is heated under a nitrogen atmosphere to a temperature lower than 2000° C. and then heated to a temperature between 2000° C. and 2300° C. under the noble gas atmosphere.

2. The silicon carbide substrate manufacturing method claimed in claim 1, wherein the CVD is performed by the use of a CVD apparatus having a heater unit and the preliminary CVDed silicon carbide substrate is formed by the CVD in a state of flowing nitrogen into the heater unit or without flowing nitrogen into the heater unit.

3. The silicon carbide substrate manufacturing method claimed in claim 1, wherein the preliminary CVDed silicon carbide substrate is heated to a temperature of 800° C. which is lower than 2000° C. and then heated to the temperature between 2000° C. and 2300° C.

* * * * *